United States Patent [15] 3,651,337

Tomisawa [45] Mar. 21, 1972

[54] SAW-TOOTH WAVE FREQUENCY DIVIDER CIRCUIT

[72] Inventor: Norio Tomisawa, Hamamatsu, Japan

[73] Assignee: Nippon Gakki Seizo Kabushiki Kaisha, Hamamatsu-shi, Japan

[22] Filed: June 2, 1970

[21] Appl. No.: 42,705

[30] Foreign Application Priority Data

June 10, 1969 Japan....................................44/45039

[52] U.S. Cl................................307/225, 307/228, 307/291, 328/158

[51] Int. Cl.........................................H03k 21/00, H03k 3/12

[58] Field of Search....................328/39, 158; 307/225, 228, 307/291

[56] References Cited

UNITED STATES PATENTS 2,783,382 2/1957 Bode.........................................328/39

*Primary Examiner*—John S. Heyman
*Attorney*—Holman & Stern

[57] ABSTRACT

In frequency divider circuit for saw-tooth wave including a circuit for producing a saw-tooth wave of a frequency *f*, a circuit for producing a square wave having a frequency *f*/2, mixing resistors, and a buffer circuit for obtaining a desired output saw-tooth wave of frequency *f*/2; the peak amplitude of the square wave is so selected as to be greater than the peak amplitude of the saw-tooth wave of a frequency *f* before mixing, and the ratio of the resistances of the mixing resistors is so selected that the peak amplitudes of the square wave component and the saw-tooth wave component in the mixed resultant wave become equal after mixing, whereby the resultant saw-tooth wave of a frequency *f*/2 has an amplitude at least equal to that of the original saw-tooth wave of frequency *f*.

5 Claims, 4 Drawing Figures

INVENTOR
Norio Tomisawa

BY Holman, Glascock, Downing & Seebold
ATTORNEYS

SAW-TOOTH WAVE FREQUENCY DIVIDER CIRCUIT

BACKGROUND OF THE INVENTION

This invention relates to a sawtooth wave frequency divider circuit, and more particularly to a type of circuit wherein a sawtooth wave having a frequency $f$ and a square wave having a frequency $f/2$ are mixed together, and a sawtooth wave of a frequency $f/2$ having the same output level (in crest value) as that of the sawtooth wave of the original frequency $f$ is obtained.

Generally speaking, all of the class A transistor amplifiers, such as an emitter follower circuit and emitter grounded type amplifier circuit, cannot have a 100 percent voltage utility factor $\eta$ (which is the ratio of a distortionless, maximum output voltage Vmax to the power source voltage E). Theoretically, if an ideal transistor is employed, a 100 percent of the utility factor $\eta$ ought to be obtained when an emitter resistor only is employed in an emitter follower circuit, or when a collector resistor only is employed in an emitter grounded type amplifier, both of which are considered to have best voltage utility factors.

However, there is no ideal transistor, practically, and because the input signal cannot be driven to 0 volt due to the existence of a restriction in the cut-off range caused by the base-emitter forward voltage drop $V_{BE}$ (this value is about 0.2 to 0.3 v., in general, for germanium transistors and about 0.6 to 0.7 v., for silicon transistors). Furthermore, the output signal cannot be swung to the maximum value because it is limited by a collector-emitter voltage drop $V_{CE}$(sat) of the saturation time (this value ranges approximately from 0.3 to 0.5 v.).

In addition, the coefficient $h_{fe}$ (current amplification factor) is not linear, and the amplification factor thereof tends to decrease at portions of the operational characteristic curve near the cut-off range and the saturation range. For these reasons, there is no class A amplifier of capacitor-resistor coupled type having a utility factor[$\eta$]of 100 percent.

On the other hand, since the output of a switching circuit such as a flip-flop has only two states, ON and OFF, the waveform distortion does not arise. Furthermore, in the latter case, the input voltage may assume a value which might over-drive the switching circuit. Thus, the only factor which lowers the voltage utility factor $\eta$ in the latter kind of circuit is the voltage drop $V_{CE}$(sat) only, and therefore a voltage utility factor $\eta$ of almost 100 percent can be easily obtained.

In view of the fact that a great number of the frequency divider circuits are employed in electronic musical instruments, it is desirable that the frequency divider circuits be of the type having the largest possible voltage utility factor $\eta$. If the voltage utility factor is higher, the required power source voltage can be lowered, and the component elements employed in such circuits may be of lower current ratings, lower breakdown voltages, and lower power ratings. Furthermore, for the purpose of obtaining a good S/N (signal to noise) ratio and for facilitating the handling thereafter, the signal levels in the electronic musical instruments should be considerably high. More specifically, according to general practice, the signals created in the tone source circuits in an electronic musical instrument must be amplified in their subsequent stage because the signals are attenuated considerably in the keyboard circuits and mixing circuits. Thus, if the signal levels from the tone source circuits are set higher beforehand, the amplifying stages thereafter required may be reduced and, the S/N ratios thereof may also be improved.

Heretofore, frequency divider circuits employable for producing a sawtooth wave have been known. A typical example of such circuits has an organization as indicated in FIG. 1 excepting that the peak amplitudes of the original sawtooth wave and the square wave are equal and the resistors $R_1$ and $R_A$ are made equal rather than different as expected in the circuit of FIG. 1, and that the DC biasing resistors are not provided in the mixer circuit.

Now the operation of a prior art circuit will be explained for a better understanding of this invention, referring, for convenience, to FIG. 1, in which it should be assumed that $V_A = V_1$, $R_A = R_{11}$, and there is no $R_2$ nor $R_3$. A trigger signal of a square or sawtooth waveform and having a frequency f is applied to the input terminal $I_A$ of a square wave frequency divider circuit O, and an output square wave $V_A$ having a frequency $f/2$ is obtained from the output terminal $O_A$ of the circuit O. This output square wave $V_A$ is then applied to the base of a transistor Tr2 through a mixing resistor $R_A$. Similarly, a sawtooth wave having a frequency $f$ is applied, through an input terminal $I_1$, to the base of a transistor Tr1 of a sawtooth buffer amplifier P, and the sawtooth output $V_1$ obtained at the output terminal $O_1$ at the emitter side of the transistor Tr1 (the output signal $V_1$ is adjusted precisely to be equal in peak amplitude to the square wave $V_A$) is applied through another mixing resistor $R_1$ ($R_1 = R_A$) to the base of the transistor Tr2. In this manner, the two signals $V_A$ and $V_1$ at an equal peak amplitude are mixed together, and a sawtooth wave $V_2$ of a frequency $f/2$ is obtained at the emitter side of the transistor Tr2 (operating as an emitter follower).

When the frequency of the sawtooth wave signal is to be further stepped down, for instance to ¼, ⅛, 1/16 . . . , the required number of the frequency divider circuits as described must be connected in cascade, and either the square-wave output signal from the terminal $O_A$ or the sawtooth output signal from the terminal $O_2$ is applied to the input terminal of the square-wave frequency divider circuit included in the subsequent sawtooth wave frequency divider circuit, so that the frequency of the sawtooth wave is further stepped down.

However, when the conventional frequency divider circuit for a sawtooth wave is employed in chain (in cascade) for stepping down the frequency, some difficulties have been experienced, thus causing the connection of the frequency divider circuits to be excessively complicated and the operations thereof to be unstable.

The principal reason for such difficulties is that the voltage utility factors for the square wave frequency divider circuit O and the sawtooth wave rendering circuit P are different from each other. Because of this difference in the voltage utility factors, the output levels of the former circuit and the latter circuit operating in a distorsion-free range are also made different, and if the power source voltages $E_A$ and $E_1$ are selected to be equal, the output level of the latter circuit will be lower than the output level of the former circuit.

More specifically, while the output level $V_A$ (in crest value) of the square wave frequency divider circuit O is nearly equal to the power source voltage $E_A$ (that is, $V_A = E_A$), the output voltage $V_1$ from the sawtooth wave producing circuit P is $V_1 = \eta E_A$ (for instance, equal to $0.8E_A$). Accordingly, when the mixing resistors $R_1$ and $R_A$ are selected to be equal, the power source voltages $E_A$ and $E_1$ must be made different if both of the output signals are to be mixed at the same level ($V_1 = V_A$).

However, even when the power source voltages $E_A$ and $E_1$ are made different as described above, the output level $V_2$ of the mixing circuit is still reduced lower than the output level $V_1$. This is because the voltage gain of the mixing circuit including the transistor Tr2 is approximately 0.8 to 0.9.

Furthermore, because of the voltage dividing ratio due to the mixing resistors and the input impedance (finite value) of the buffer amplifying circuit including the transistor Tr2 as shown in FIG. 1, and also because of the value of the voltage drop $V_{BE}$, which is not negligible, the DC voltage at the output terminal $O_2$ is lower than that of the output terminal $O_1$.

When a plurality of frequency divider circuits for the sawtooth wave as described are connected in cascade for stepping down the frequency, the output levels of the subsequent stages are continuously lowered, and the DC potentials thereof are also lowered, the latter result making it difficult to maintain the operating point in the operation characteristics of the subsequent stage at an adequate DC potential.

SUMMARY OF THE INVENTION

Therefore, the primary object of the present invention is to provide an improved frequency dividing circuit for sawtooth waves whereby all of the above described drawbacks of the conventional circuits can be substantially eliminated.

Another object of the present invention is to provide an improved frequency divider circuit for sawtooth waves wherein the output level (peak amplitude) of a sawtooth wave having a frequency $f/2$ is made equal to the original level of a sawtooth wave having a frequency $f$.

A further object of the present invention is to provide an improved frequency divider circuit for sawtooth waves wherein the DC potential at the output terminal of the sawtooth wave of a frequency $f/2$ is made equal to the DC potential at the output terminal of the sawtooth producing circuit having a frequency $f$.

Yet another object of the present invention is to provide an improved frequency divider circuit for sawtooth waves which can be connected in cascade without reducing the output level of the signal, the frequency of which is divided as required.

Still another object of the present invention is to provide an improved frequency divider circuit for sawtooth waves wherein only a single power source voltage is required.

These and other objects of the present invention can be achieved by an improved frequency divider circuit for sawtooth wave which comprises a circuit for generating a sawtooth wave having a frequency $f$, a circuit for generating a square wave having a frequency of a greater amplitude, mixing resistors through which the output signals from the above mentioned two circuits are mixed together, the mixing resistors being so selected that the ratio thereof is equal to the ratio of the sawtooth wave signal level and the square wave signal level from the respective circuits, and a buffer circuit for obtaining a desired output sawtooth wave of a frequency $f/2$.

Preferably, the buffer circuit is further provided with a biasing means for the base electrode so that the DC potential of the base electrode is raised from that of the output terminal of the sawtooth wave producing circuit by an amount equal to the aforementioned voltage drop $V_{BE}$ across the base and emitter of the transistor included in the buffer circuit, and, by so doing, the DC potential of the output terminal of the buffer circuit is made equal to that of the output terminal of the sawtooth wave producing circuit.

Preferably, the sawtooth wave producing circuit is arranged in the form of another buffer amplifier, and the square wave producing circuit is arranged in the form of a flip-flop.

And preferably, a single power source supplies power to all of the above mentioned circuits.

The invention will be better understood from the following detailed description when read in conjunction with the accompanying drawing.

DETAILED DESCRIPTION OF THE INVENTION

Figures 2A, 2B:
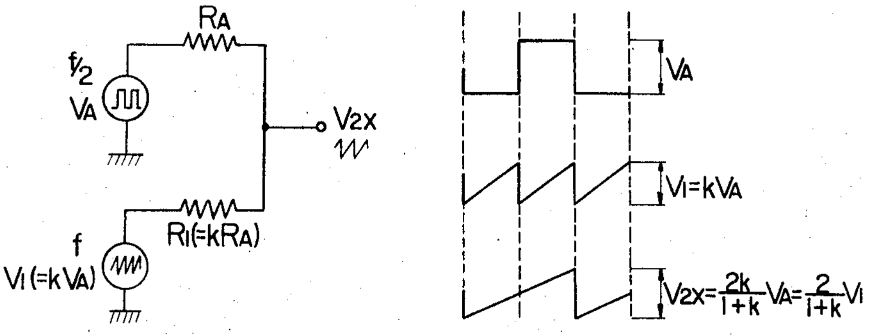
FIGS. 2(a) and 2(b) are a schematic diagram and a waveform chart to be referred to for an explanation of the fundamental principle of the present invention.

Referring first to FIG. 2 showing the principle of how the frequency of a sawtooth wave is divided into one half by mixing a square wave and a sawtooth wave, which it utilized in the present invention, it is seen that a square wave $V_A$ (in crest value) of a frequency $f/2$ and a sawtooth wave $V_1$ (also in crest value, and $V_1 = kV_A$, where $k$ is a coefficient) of a frequency $f$ are mixed together in a specific phase-relation as indicated therein through mixing resistors $R_A$ and $R_1$. $R_1$ is selected to be equal to $KR_A$ so that the mixing voltage losses in these resistors are thereby made so different that the mixing ratio of the square wave to the sawtooth wave will be $k$:1, and as a result, the mixed components of the two waves become equal after being mixed, thereby forming a sawtooth wave $V_{2}x$ of a frequency $f/2$.

In this case, the output level (in crest value) $V_{2x}$ can be empirically expressed as $$V_{2x} = (2k/1 + k)\ V_A = (2/(1 + k))\ V_1$$

Figure 3:
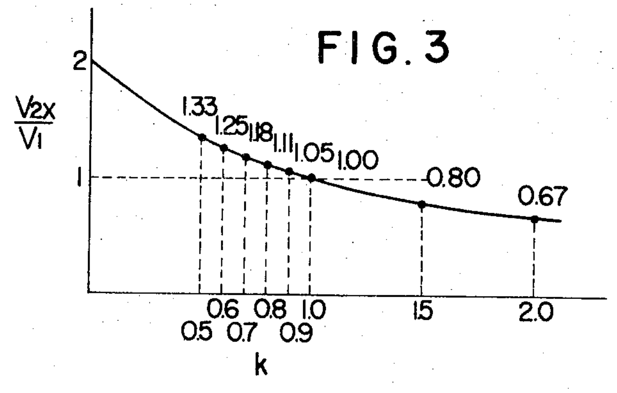
FIG. 3 is a graphical representation of the ratio $V_2x/V_L$, which is varied in accordance with a coefficient $k$.

More specifically, the level of the mixed wave $V_{2x}$ is generally different from the level of the input $V_1$, the difference depending on the value of $k$, and when $k<1$, the output $V_{2x}$ becomes larger than $V_1$, whereby a kind of gain is indicated, which is the most significant feature of this invention and is to be remembered. The value of $V_{2x}/V_1$ with variation of the coefficient $k$ is shown in FIG. 3.

A preferred embodiment of this invention will now be described with reference to FIG. 1.

An output $V_A$ of a frequency $f/2$ from a square wave frequency divider circuit O, which, in this example, is an ordinary flip-flop, is applied to the base of a transistor Tr2 through a mixing resistor $R_A$. Simultaneously, another output $V_1$ having a frequency $f$ and obtained from a sawtooth wave producing circuit P, which is in itself a buffer circuit, is applied through another mixing resistor $R_1$ to the base of the transistor Tr2. To this base of the transistor Tr2, there is connected a resistor $R_2$ for serving as a DC bias, and, when necessary, also a grounded resistor $R_3$. The resultant output wave is obtained at the emitter of the transistor Tr2. Now the output $V_1$ (in crest value) is lower than the output $V_A$ of the square wave (also in crest value), so that $V_1 = k\ V_A$, wherein $k<1$.

While the values of the mixing resistors $R_A$ and $R_1$ as described are also selected to satisfy a relation $R_1 = k\ R_A$, both the square wave and the sawtooth wave are mixed together under the same levels at the junction X between the mixing resistors $R_A$ and $R_1$. For the convenience in further explanation, it is assumed that the load impedance at the junction point X is infinitive and also that the level (crest value) of the sawtooth wave at this point is $V_{2x}$. Then the above described relation $$V_{2x} = (2/1 + k)\ V_1$$

is satisfied, and it is also apparent from this equation that $V_{2x} > V$.

However, the actual load impedance as considered from the point X, which consists of the input impedance of the transistor Tr2 and impedances of other parallelly connected circuits, (in this case, $R_2$ and $R_3$) is not infinitive, and hence the voltage at the point X is not exactly equal to the above described $V_{2x}$ but is a velue $V'_{2x}$ slightly lower than the $V_{2x}$. The output voltage $V_2$ obtained from the output terminal $O_2$ is still lower than the voltage $V'_{2x}$ because of the existence of the voltage drop $V_{BE}$ of the transistor Tr2 and the load (not shown) connected to the output terminal $O_2$.

Accordingly, by suitably selecting the value of $k$, representing the ratio between the resistor $R_1$ and $R_A$, the advantageous result of the output level $V_2$ from the terminal $O_2$ being equal to the output level $V_1$ of the sawtooth wave producing circuit can be obtained. For instance, when the above described voltage loss $V_2/V_{2x}$ is 0.8, the voltage ratio of $V_{2x}/V_1 = 1.25$ can be obtained by causing the value of $k$ to be $k = 0.6$, and the advantageous result of $V_2 = V_1$ can be realized.

As is apparent from the above description, according to the present invention, the resistance values of the mixing resistors $R_A$ and $R_1$ ($R_1 = k\ R_A$) are suitably selected so that the mixing ratio of the two signals is not unity, that is, the value of $k$ is a suitable value lower than 1, whereby the output levels $V_1$ and $V_2$ (in Crest value) may be adjusted so that $V_1 = V_2$ or even $V_2 > V_1$.

Figure 1:
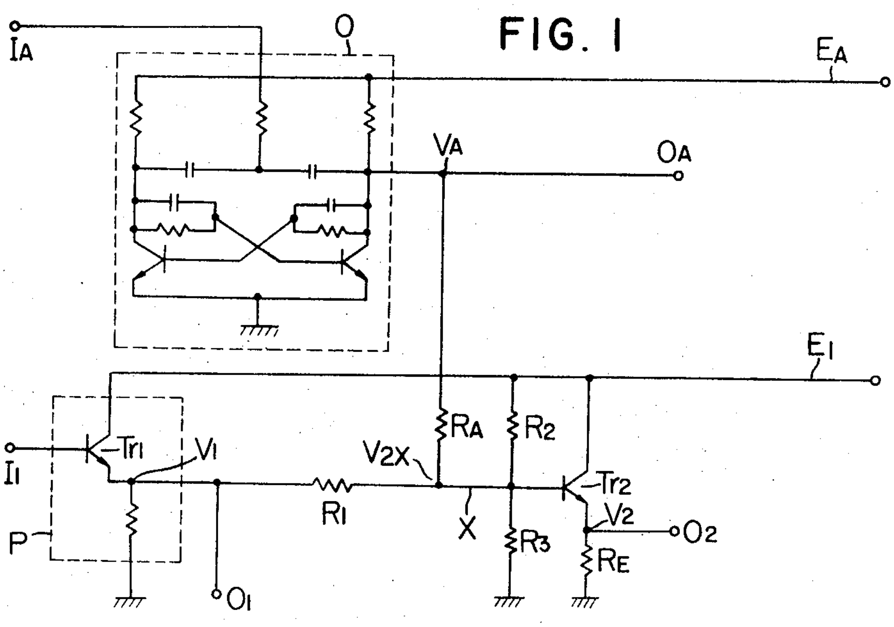
FIG. 1 is a block diagram showing a frequency divider circuit for a sawtooth wave which constitutes a preferred embodiment of the present invention.

Furthermore, for the purpose of equalizing the DC potential at the output terminal $O_2$ with the DC potential at the terminal $O_1$, for instance, a bias adjusting resistor $R_2$ with or without another resistor $R_3$ may be employed as indicated in FIG. 1, in which case the values of the resistors $R_2$ and $R_3$ are selected so that the DC potential at the junction point X is higher than that of the output terminal $O_1$ by a value equal to the above mentioned forward voltage drop $V_{BE}$ between the base and emitter of the transistor Tr2. By so doing, several of the frequency divider circuits as described above may also be connected sequentially with the operating point in each stage being maintained constant.

In addition, the output level $V_A$ for the square wave signal may be selected larger than the output level $V_1$ for the sawtooth wave signal, and for this reason, a single power source voltage may be commonly employed for all of the component circuits such as the above described square wave producing circuit, of a good power voltage utility factor, sawtooth wave producing circuit of a little worse utility factor and the mixing buffer circuit. Thus, the organization of the frequency divider circuit for sawtooth wave can be greatly simplified, and the voltage utility factors in respective stages of the cascade connected circuits can be much improved.

Although the present invention has been described with respect to a preferred embodiment thereof, it will be apparent to those skilled in the art that various modifications and alterations thereof may also be practiced without departing from the true spirit and scope of the present invention. For instance, the square wave producing circuit may be any one of conventional circuits other than the above described flip-flop, and the transistors in the buffer circuits may be replaced by field-effect transistors.

I claim:

1. A frequency dividing and mixing circuit comprising: a first circuit having an output terminal and producing a sawtooth wave with a first peak amplitude and a first frequency; a second circuit having an output terminal and producing a square wave with a second peak amplitude greater than said first peak amplitude and a frequency which is one-half of said first frequency; a buffer circuit connected to said first and second circuits and producing a resultant sawtooth wave of frequency which is one-half of said first frequency and with a peak amplitude greater than said first peak amplitude; a first mixing resistor connected between the output terminal of said first circuit and an input terminal of the buffer circuit; and a second mixing resistor connected between the output terminal of said second circuit and the input terminal of the buffer circuit, said first and second resistances being of such resistance values that the ratio of the first resistance to the second resistance is equal to the ratio of said first peak amplitude to said second peak amplitude.

2. A frequency dividing and mixing circuit as defined in claim 1 wherein a biasing means is included in said buffer circuit so that a DC potential at an output of the buffer circuit is made equal to the DC potential at the output of said first sawtooth wave producing circuit, whereby a required number of sawtooth wave frequency dividers can be connected in cascade.

3. A frequency dividing and mixing circuit as defined in claim 1 wherein said sawtooth wave producing first circuit, said square wave producing second circuit, and said buffer circuit are all provided with connecting means to connect them to a common power source.

4. A frequency dividing and mixing circuit as defined in claim 1 wherein said second circuit producing a square wave comprises a flip-flop circuit.

5. A frequency dividing and mixing circuit as defined in claim 1 wherein said buffer circuit is in the form of an emitter follower amplifier.

* * * * *